(12) United States Patent
Kanda

(10) Patent No.: US 12,284,764 B2
(45) Date of Patent: Apr. 22, 2025

(54) BACKUP PIN AND AUTOMATIC BACKUP PIN EXCHANGE SYSTEM

(71) Applicant: FUJI CORPORATION, Chiryu (JP)

(72) Inventor: Tomohisa Kanda, Anjo (JP)

(73) Assignee: FUJI CORPORATION, Chiryu (JP)

( * ) Notice: Subject to any disclaimer, the term of this patent is extended or adjusted under 35 U.S.C. 154(b) by 1179 days.

(21) Appl. No.: 17/059,820

(22) PCT Filed: Jun. 1, 2018

(86) PCT No.: PCT/JP2018/021134
§ 371 (c)(1),
(2) Date: Nov. 30, 2020

(87) PCT Pub. No.: WO2019/229968
PCT Pub. Date: Dec. 5, 2019

(65) Prior Publication Data

US 2021/0219473 A1 Jul. 15, 2021

(51) Int. Cl.
*H05K 13/04* (2006.01)
*B25J 9/00* (2006.01)
(Continued)

(52) U.S. Cl.
CPC ........ *H05K 13/0486* (2013.01); *B25J 9/0096* (2013.01); *B25J 15/0033* (2013.01); *G06T 7/0004* (2013.01); *G06T 7/70* (2017.01); *H05K 13/0069* (2013.01); *G06T 2207/30141* (2013.01); *G06V 2201/06* (2022.01)

(58) Field of Classification Search
CPC ........................ H05K 13/0069; H05K 13/0486
See application file for complete search history.

(56) References Cited

U.S. PATENT DOCUMENTS

| 8,661,657 | B2 | 3/2014 | Ito et al. |
| 10,223,781 | B2 | 3/2019 | Kawai |
| 2011/0268346 | A1* | 11/2011 | Ito ...................... H05K 13/0069 361/767 |

FOREIGN PATENT DOCUMENTS

| CN | 102238862 A | 11/2011 |
| CN | 104704940 A | 6/2015 |

(Continued)

OTHER PUBLICATIONS

International Search Report issued on Jul. 10, 2018 in PCT/JP2018/021134 filed on Jun. 1, 2018, citing documents AA and AQ therein, 2 pages.

*Primary Examiner* — Livius R. Cazan
(74) *Attorney, Agent, or Firm* — Oblon, McClelland, Maier & Neustadt, L.L.P.

(57) ABSTRACT

A backup pin configured to support from below a circuit board can be one of a soft backup pin or a hard backup pin. The soft backup pin includes a soft pin portion formed of a soft elastic material and configured to support from below the circuit board and an engaging pin portion configured to be held in engagement and released from engagement by an engagement holding tool attached to a mounting head of the component mounter performing raising and lowering, as well as rotating operations, the soft pin portion and the engaging pin portion being provided side by side. The engaging pin portion is formed into a shape common to an engaging portion of the hard backup pin which is held in engagement by the engagement holding tool.

9 Claims, 10 Drawing Sheets

(51) Int. Cl.
*B25J 15/00* (2006.01)
*G06T 7/00* (2017.01)
*G06T 7/70* (2017.01)
*H05K 13/00* (2006.01)

(56) References Cited

FOREIGN PATENT DOCUMENTS

| CN | 105027697 A | 11/2015 | |
|---|---|---|---|
| EP | 2966952 A1 * | 1/2016 | ......... H05K 13/0061 |
| JP | 2011-14626 A | 1/2011 | |
| JP | WO2015/040755 A1 | 3/2015 | |
| JP | 6037412 B2 | 12/2016 | |

* cited by examiner

BACKUP PIN AND AUTOMATIC BACKUP PIN EXCHANGE SYSTEM

TECHNICAL FIELD

The present description discloses a technique for a backup pin for supporting from below a circuit board on which a component is mounted at a component mounting station of a component mounter and an automatic backup pin exchange system for automatically exchanging such backup pins.

BACKGROUND ART

Recently, as a tendency of making component mounting boards thinner is progressing, component mounting boards are likely to be bent, when a component is mounted on a circuit board in a component mounter, multiple backup pins are disposed on a backup plate located below the circuit board to support the circuit board from below, thereby attempting to prevent the circuit board from being bent. Additionally, there are also many demands for double-sided mounting boards in which components are mounted on both sides of a circuit board to meet the recent requests for high-density mounting and miniaturization. When producing such a double-sided mounting board in a component mounter, at first, components are mounted on a first side of a board, thereafter the board is turned over and is then re-loaded in the component mounter, so that components are mounted on a second side of the board.

In mounting components on the remaining or second side of the board, in the event that a backup pin for supporting the board from below strikes against a pre-mounted component on the first side, which now constitutes a lower side, of the board, a possibility is caused that the pre-mounted component is damaged or the board is pushed up, and hence, as described in Patent Literature 1 (International Publication WO2015/040755), a backup pin is formed of a soft and elastic material such as urethane or the like, so that in the event that a distal end portion of the pin so formed strikes against a pre-mounted component, the backup pin can be elastically deformed, which turns out preventing the pre-mounted component from being damaged or the board from being pushed up by the backup pin. In general, a soft backup pin, which can be elastically deformed as described above, is called a "soft pin", whereas a hard backup pin, which is not elastically deformed, is called a "hard pin".

Additionally, in order to automate work of exchanging backup pins or changing an arrangement of backup pins on a backup plate in accordance with types of component mounting boards to be produced, as described in Patent Literature 2 (JP-A-2011-14626), there is provided a technique in which a backup pin suction nozzle is attached to a mounting head of a component mounter to exchange backup pins or change an arrangement of backup pins by picking up backup pins with the suction nozzle.

Alternatively, as described in Patent Literature 1 and Patent Literature 3 (U.S. Pat. No. 6,037,412), there is provided a technique in which a chuck device is attached to a mounting head of a component mounter so as to exchange backup pins or change an arrangement of backup pins by holding a backup pin with chuck claws of the chuck device.

PATENT LITERATURES

Patent Literature 1: International Publication WO2015/040755
Patent Literature 2: JP-A-2011-14626
Patent Literature 3: Japanese Patent No. 6037412

SUMMARY OF THE INVENTION

Technical Problem

Since a backup pin is, in general, larger in size and heavier in weight than a component to be mounted on a circuit board, in the case that backup pins are exchanged or an arrangement of backup pins is changed with the suction nozzle attached to the mounting head as described in Patent Literature 2 mentioned above, a suction force of the suction nozzle for such a backup pin is insufficient, whereby there is caused a possibility that a positional deviation occurs in a backup pin picked by and held to the suction nozzle or the backup pin falls.

On the other hand, as in the case with Patent Literatures 1 and 3, in the case that backup pins are exchanged or an arrangement of backup pins is changed with the chuck device attached to the mounting head, although an advantageous effect can be expected in which the backup pin can be held more stably with the chuck device than with the suction nozzle to thereby prevent the backup pin held with the chuck device from deviating in position or falling, since the chuck device requires a mechanism for operating the chuck claws, which are configured to hold a backup pin therebetween, to open and close, there is an inherent drawback that the device for holding a backup pin is made larger in size and higher in cost. Moreover, there is also a possibility that the chuck claws, which open and close, come into interference with backup pins lying adjacent thereto, whereby the adjacent backup pins are caused to deviate in position or are damaged.

Further, in the case that either of the soft backup pin (the soft pin) and the hard backup pin (the hard pin) is selected for use in accordance with a type of component mounting board to be produced, although it is considered that the chuck device is used to exchange backup pins or change an arrangement of backup pins as described in Patent Literatures 1, 3 mentioned above, as this occurs, there are caused the problem in that the backup pin holding device is made larger in size and higher in cost, as well as the problem in that the chuck claws, which open and close, come into interference with the adjacent backup pins.

Solution to Problems

With the view to solving the problems, there is provided a backup pin for supporting from below a circuit board on which a component is mounted at a component mounting station of a component mounter, the backup pin constituting a soft backup pin configured to be exchanged for a hard backup pin formed of a hard material and including a soft pin portion formed of a soft elastic material and configured to support from below the circuit board and an engaging pin portion configured to be held in engagement and released from engagement by an engagement holding tool attached to a mounting head of the component mounter performing raising and lowering, as well as rotating operations, the soft pin portion and the engaging pin portion being provided side by side, wherein the engaging pin portion is formed into a shape common to an engaging portion of the hard backup pin which is held in engagement with the engagement holding tool.

With this configuration, in holding the engaging pin portion of the soft backup pin, in which the soft pin portion and the engaging pin portion are provided side by side, in engagement using the engagement holding tool attached to the mounting head of the component mounter, since the engaging pin portion is held in engagement through a bayonet-type engagement in which the engaging pin portion is held in engagement and released from engagement by the management holding tool performing the raising and lowering, as well as rotating operations, the engagement holding tool itself needs no movable section such as an opening and closing mechanism or the like, and hence, when compared with the conventional chuck device, the configuration for holding the backup pin can be made simple in structure and small in size, and when compared with the conventional configuration for holding the backup pin by means of the suction force of negative pressure of the suction nozzle, the backup pin can be held mechanically stably and in a secured fashion as a result of the engaging pin portion being brought into such engagement. Moreover, since the engaging pin portion of the soft backup pin is formed into the shape common to the engaging portion of the hard backup pin that is held in engagement by the engagement holding tool, even in the case that either of the soft backup pin and the hard backup pin is held in engagement, the selected backup pin can be held in engagement using the same engagement holding tool, hence, requiring no exchange work of engagement holding tools.

DESCRIPTION OF EMBODIMENTS

Hereinafter, two first and second embodiments, which are disclosed in the present description, will be described below.

First Embodiment

A first embodiment will be described based on FIGS. 1 to 9. Two types of backup pins 10, 20 are shown in FIGS. 1 to 4, and backup pin 10 constitutes a soft backup pin 10 which can elastically be deformed at a pin distal end portion (soft pin portion 12), while backup pin 20 constitutes a hard backup pin 20 which is not elastically deformed, so that either of backup pins 10, 12 is selected for use in accordance with a type of a component mounting board to be produced.

Figure 1:
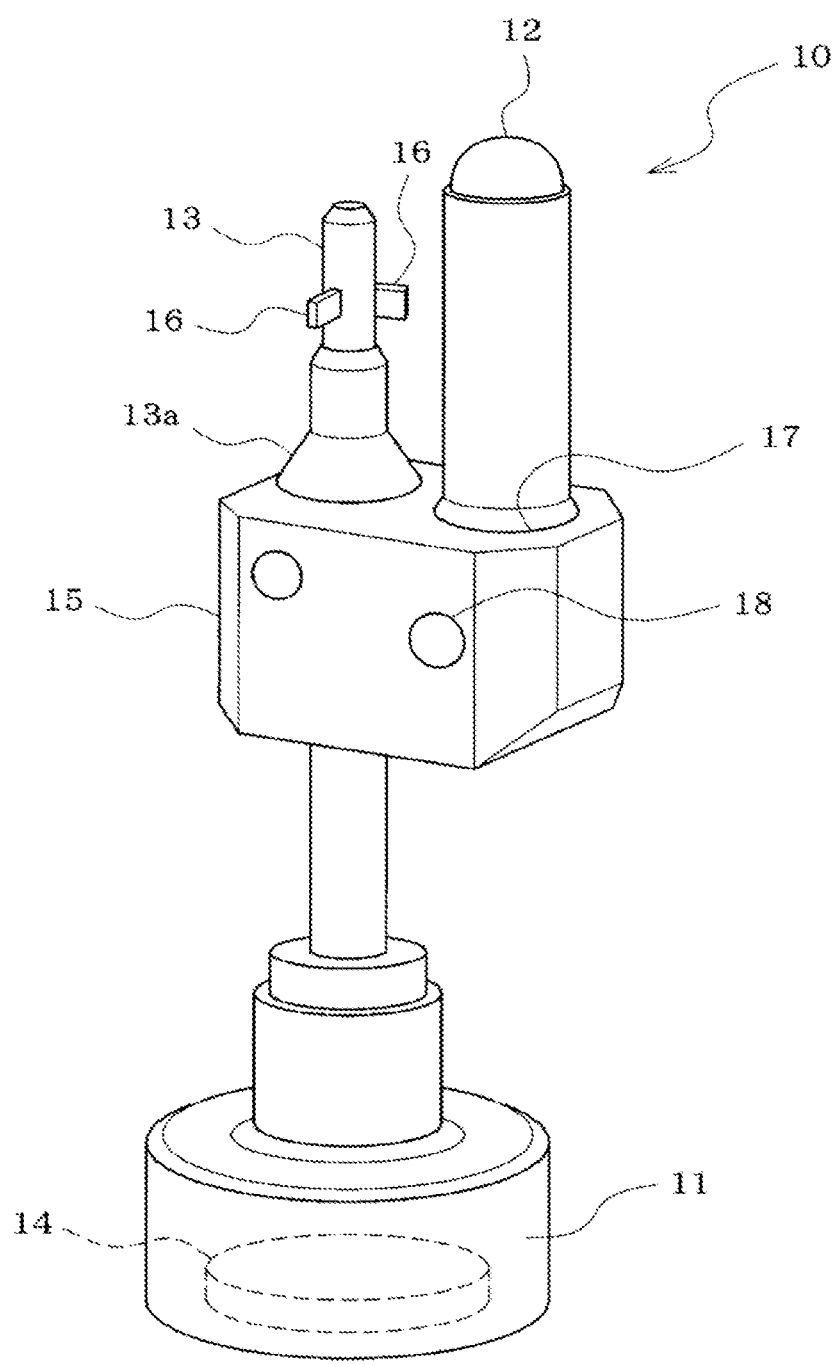
FIG. 1 is a perspective view showing a soft backup pin of a first embodiment.

Firstly, the configuration of soft backup pin 10, which can elastically be deformed at the pin distal end portion (soft pin portion 12), will be described using FIGS. 1 to 3.

Soft backup pin 10 includes base section 11 disposed at a lower section side thereof, as well as soft pin portion 12 and engaging pin portion 13, which are provided side by side above base section 11. Base section 11 is formed of a hard material such as metal, plastic, or the like into a stepped strut-like shape, and magnet 14, which is configured to hold backup pin 10 onto backup plate 46, which will be described later, by means of a magnetic force, is provided in a lower section of base section 11.

Holder section 15, which is configured to support soft pin portion 12 and engaging pin portion 13 in such a manner as to be oriented upwards, is provided at an upper section side of base section 11. This holder section 15 may be formed integrally with base section 11 or may be formed as a separate member, which is then fixed to an upper end portion of base section 11 through, for example, screwing, caulking, bonding, welding, crimping, or the like.

Engaging pin portion 13 may be formed of a hard material such as metal, plastic, or the like integrally with holder section 15 or may be formed as a separate member, which is then fixed to an upper surface side of holder section 15 through, for example, screwing, caulking, bonding, welding, crimping, or the like. Engaging pin portion 13 is formed into a shape common to engaging portion 25 of hard backup pin 20 which is held in engagement by engagement holding tool 30, which will be described later on. In the present first embodiment, multiple (for example, three) engagement protrusions 16 are formed on an outer circumferential portion of engaging pin portion 13 in such a manner as to be disposed at equal intervals on the same circumference as shown in FIG. 2.

In the case of forming engaging pin portion 13 separately from holder section 15, engaging pin portion 13 may be configured to be attached to holder section 15 in an exchangeable fashion, so as to be exchanged for a member or body having a shape common to engaging portion 25 of hard backup pin 20. Alternatively, engaging pin portion 13 may be configured so that an axial angle thereof (positions of engagement protrusions 16) can be adjusted.

On the other hand, soft pin portion 12 is formed of a soft elastic material such as urethane, rubber, or the like, and an upper end portion thereof is formed substantially into a spherical shape (a rounded shape). A height of soft pin portion 12 at an upper end thereof is higher than a height of engaging pin portion 13 at an upper end thereof, and as shown in FIG. 3, engaging pin portion 13 is set so that the upper end thereof does not come into contact with circuit board 35 when circuit board 35 is supported from below by soft pin portion 12. In the present first embodiment, a lower end portion of soft pin portion 12 is fitted in mounting hole 17 formed in holder section 15 and is fixed in place with screw 18, and soft pin portion 12 can be exchanged for another by loosening screw 18. Alternatively, the height of soft pin portion 12 at the upper end thereof may be configured to be adjusted by loosening screw 18.

Figure 2:
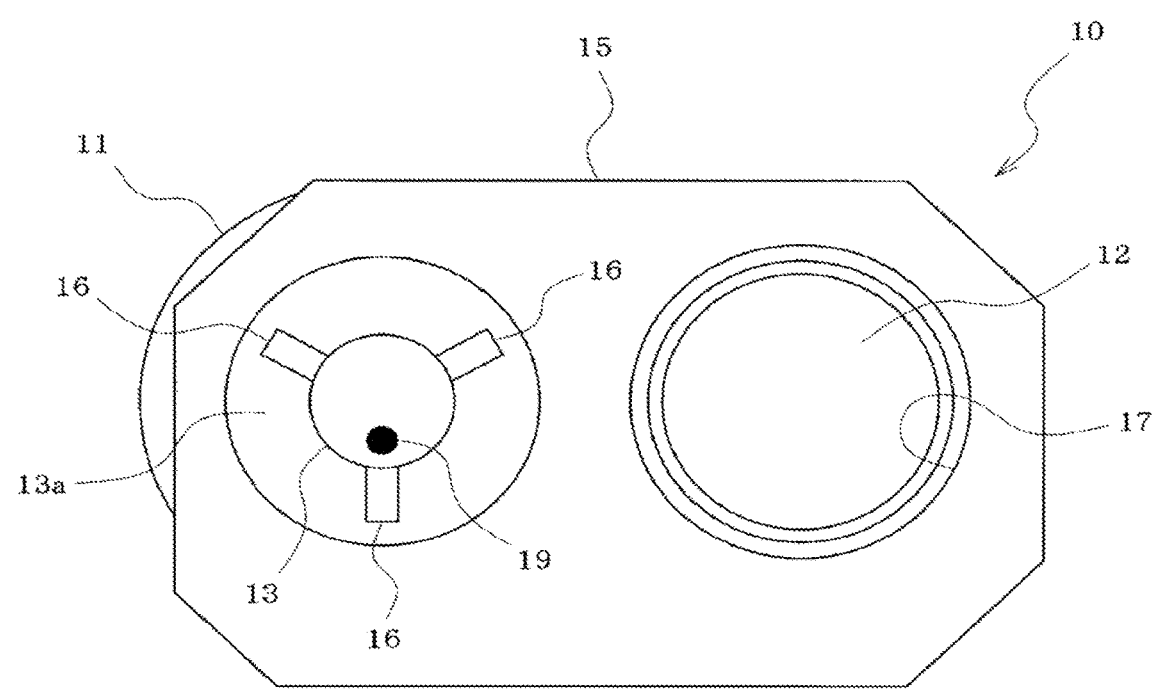
FIG. 2 is a plan view of the soft backup pin as viewed from above.
Figure 3:
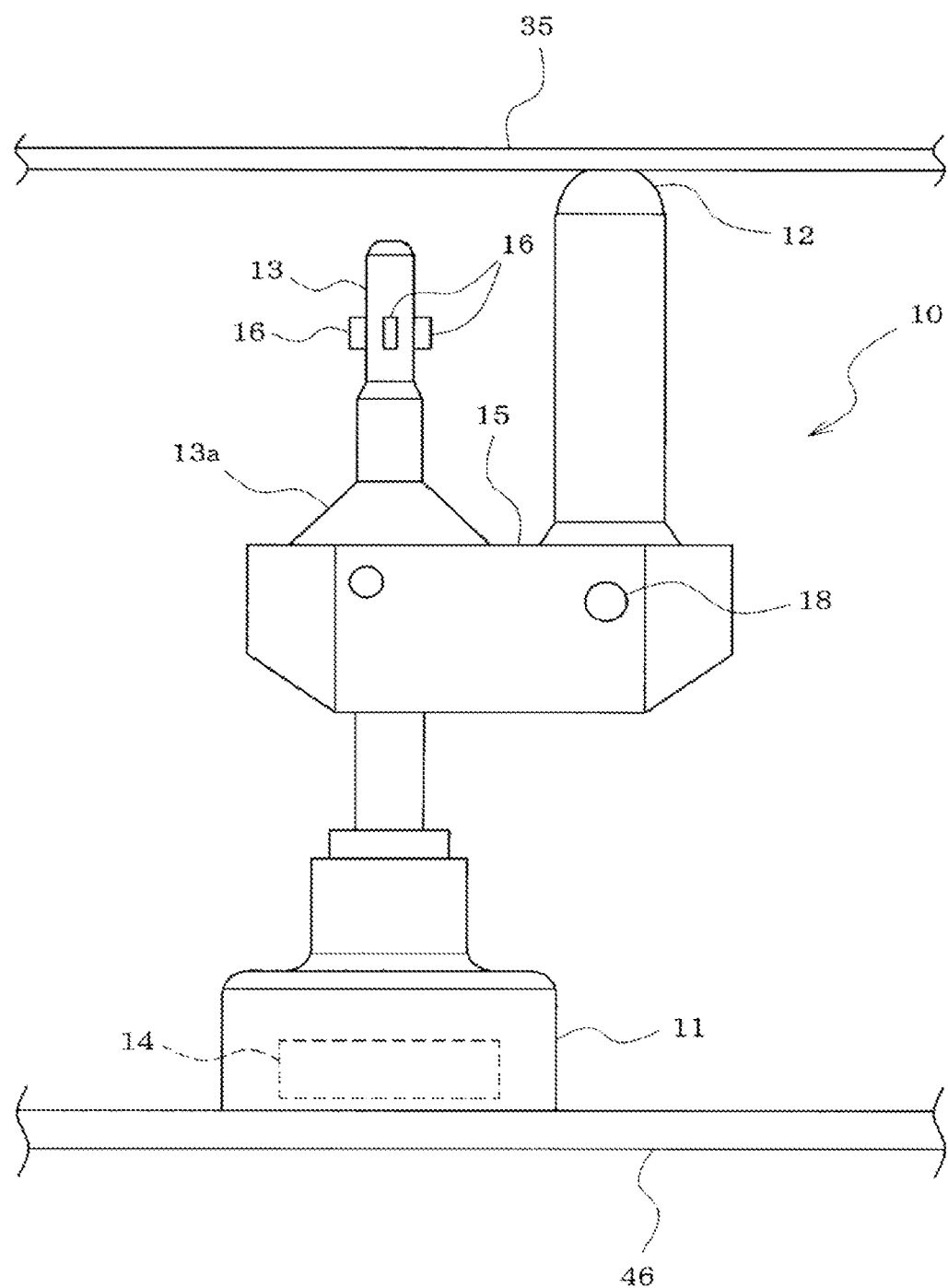
FIG. 3 is a front view showing a state in which a circuit board is supported from below by a soft pin portion of the soft backup pin.

As shown in FIG. 2, identification section 19 is provided on an upper end face of engaging pin portion 13 to discriminate engaging pin portion 13 or soft backup pin 10 from hard backup pin 20 through image processing. This identification section 19 is provided in a position lying offset from an axial center of engaging pin portion 13, so that a direction in which soft pin portion 12 is positioned with respect to engaging pin portion 13 can be determined by determining on an offset direction of identification section 19 through image processing. In an example shown in FIG. 2, soft pin portion 12 is illustrated as being positioned to the right of engaging pin portion 13 when the offset direction of identification section 19 is downward; however, the embodiment is not limited to this, and hence, soft pin portion 12 may be positioned to the right of engaging pin portion 13 when the offset direction of identification section 19 is rightward. Identification section 19 may take any shape, color, material, and the like, as long as identification section 19 can be recognized, in terms of image, as being different or discriminated from the upper end face of engaging pin portion 13.

In the present first embodiment, a lower section of engaging pin portion 13 is formed into a tapered shape in which the lower section gets gradually wider as it extends downwards, so that a circular portion at a lower end of tapered portion 13a so formed can be recognized, in terms of image, as being discriminated from holder section 15 through image processing. This tapered portion 13a may be colored in any color enabling tapered portion 13a to be easily recognized, in terms of image, as being discriminated from holder section 15. As a result, tapered portion 13a of engaging pin portion 13 constitutes a mark by which the position of engaging pin portion 13 is recognized in terms of image. Incidentally, the mark, by which the position of engaging pin portion 13 is recognized in terms of image is not limited to tapered portion 13a of engaging pin portion 13, and hence, the whole of the upper end face or a central portion of the upper end face of engaging pin portion 13 is colored in any color enabling the relevant portion of engaging pin portion 13 to be recognized, in terms of image, as being discriminated from the other portions, so that the portion so colored may constitute a mark by which the position of engaging pin portion 13 is recognized in terms of image.

Figure 4:
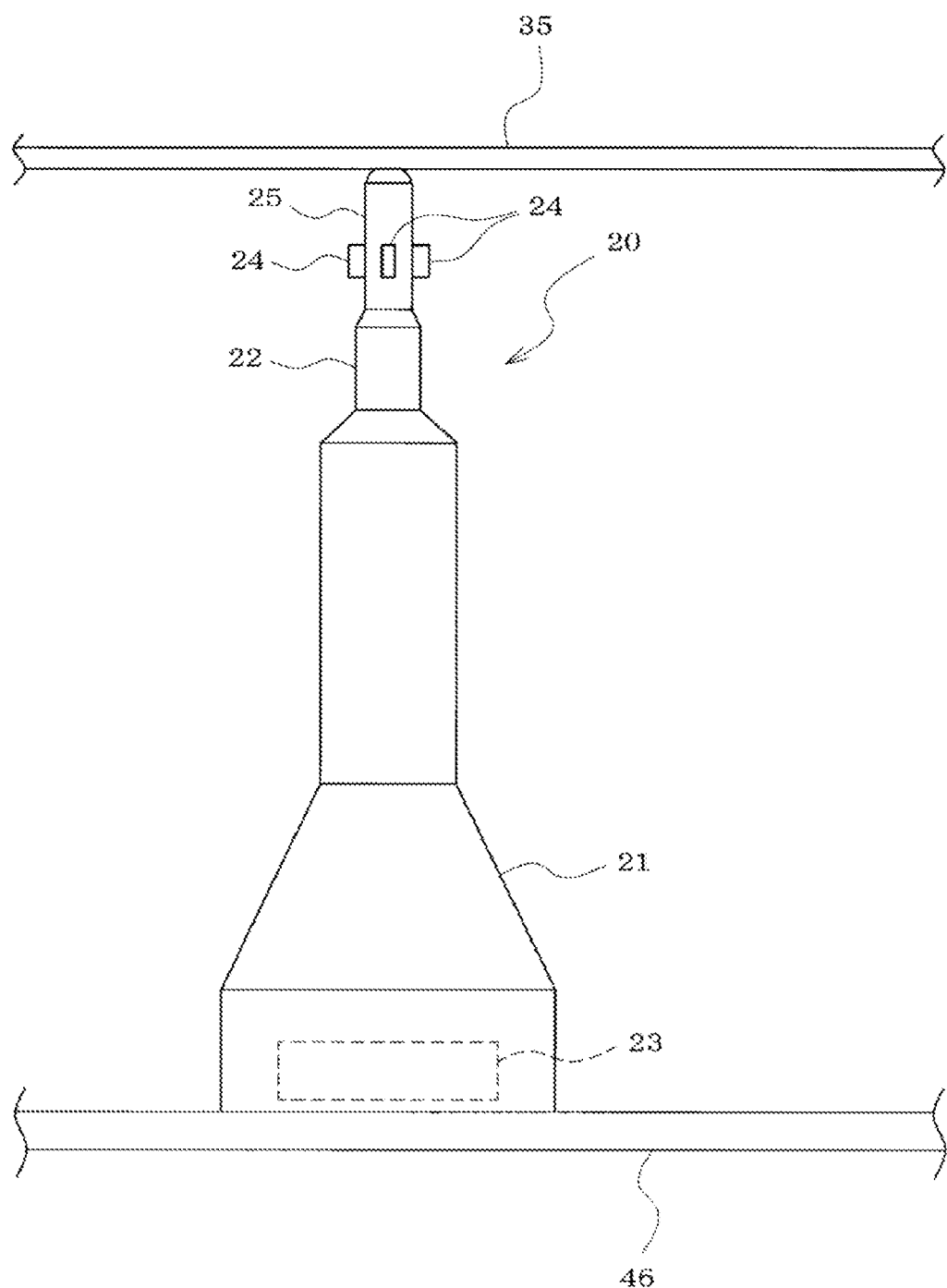
FIG. 4 is a perspective view showing a hard backup pin.
Figure 5:
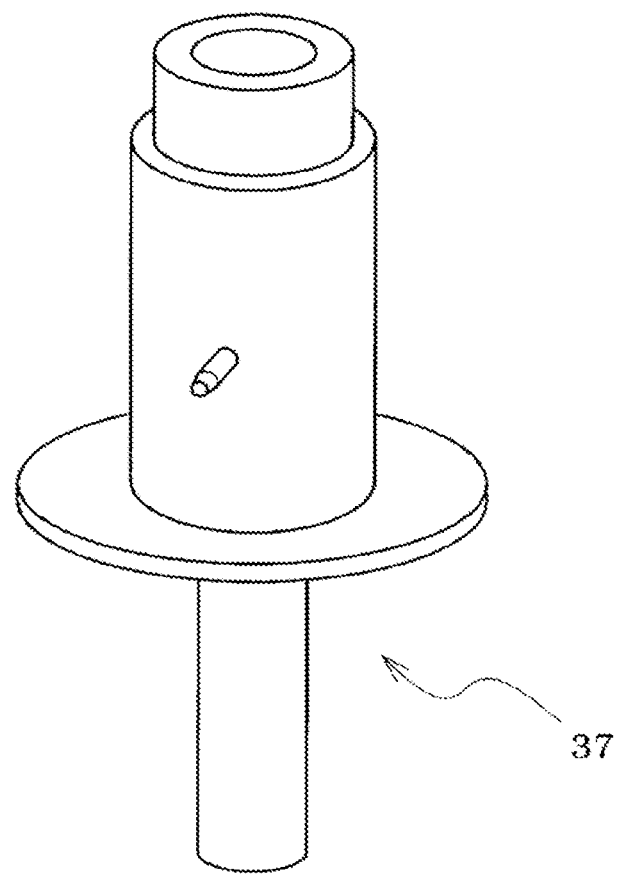
FIG. 5 is a perspective view showing a suction nozzle.

Next, the configuration of hard backup pin 20, which is not elastically deformed, will be described by use of FIG. 4. Hard backup pin 20 includes base section 21 at a lower section side and hard pin portion 22 provided on base section 21 in such a manner as to be oriented upwards. Base section 21 and hard pin portion 22 are formed of a hard material such as metal, plastic, or the like integrally with each other, and magnet 23, which is configured to hold backup pin 20 onto backup plate 46, which will be described later on, by means of a magnetic force, is provided in a lower section of base section 21. An upper section side of hard pin portion 22 constitutes engaging portion 25 which is formed into a shape common to engaging pin portion 13 of soft backup pin 10 and on a circumferential portion of which multiple engagement protrusions 24, which are held in engagement with engagement holding tool 30, are formed at equal intervals.

Figure 6:
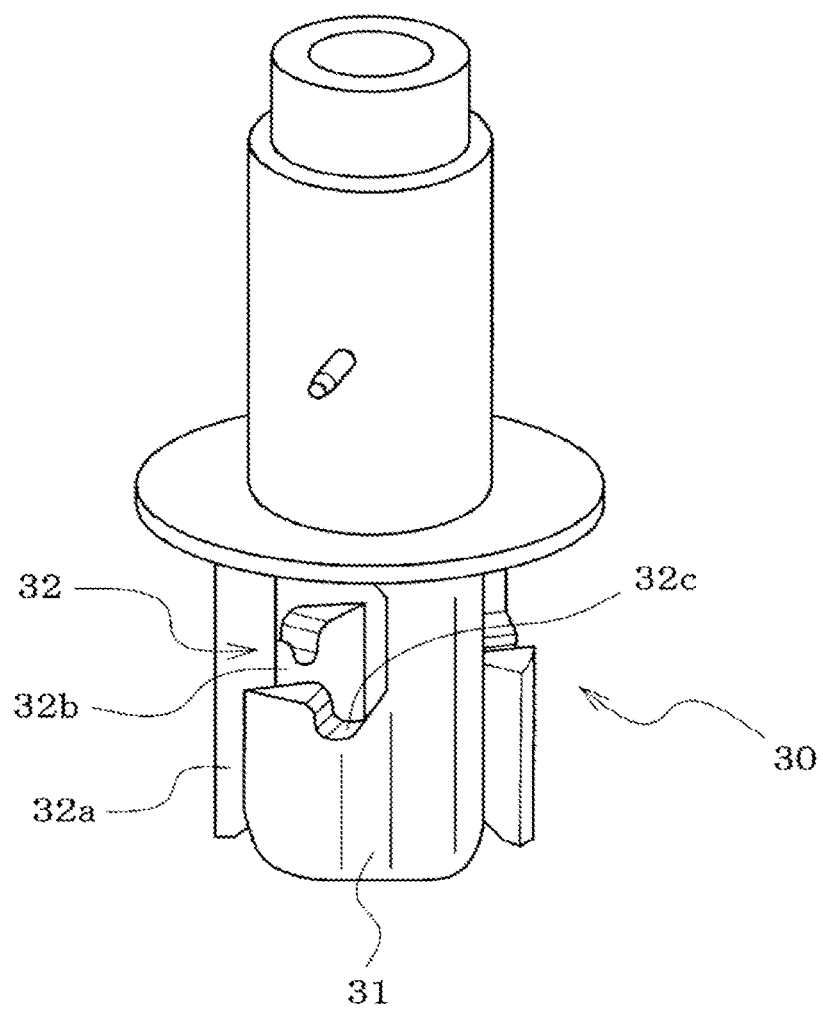
FIG. 6 is a perspective view showing an engagement holding tool.
Figure 7:
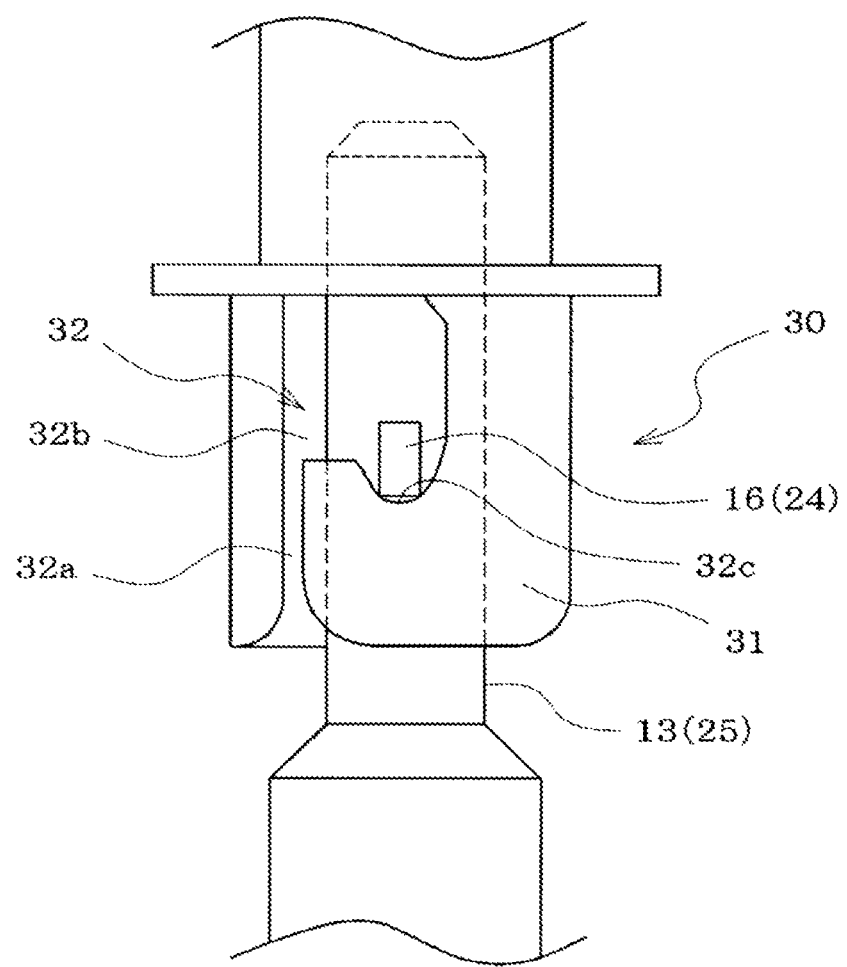
FIG. 7 is a side view showing a state in which the engagement holding tool holds in engagement an engaging pin portion of the soft backup pin.

Next, the configuration of engagement holding tool 30 will be described by use of FIGS. 6 and 7. An upper section side of engagement holding tool 30 is formed into a shape common to an upper section side of suction nozzle 37 (refer to FIG. 5) for picking up a component, so that engagement holding tool 30 is held onto a mounting head (not shown) of a component mounter in such a manner as to be exchanged for suction nozzle 37.

Portion 31 at a lower section side of engagement holding tool 30 is formed into a cylindrical shape into which engaging pin portion 13 of soft backup pin 10 (or engaging portion 25 of hard backup pin 20) is inserted, and in resulting cylindrical portion 31, multiple engaging grooves 32 are formed which hold multiple engagement protrusions 16 of soft backup pin 10 (or multiple engagement protrusions 24 of hard backup pin 20) through a bayonet-like engagement therewith. Each engaging groove 32 is formed substantially into an inverted J-shape as a whole and has vertical groove section 32a extending upwards from a lower end of cylindrical portion 31 and lateral groove section 32b extending in a lateral direction from an upper section side of vertical groove section 32a, and engagement recessed section 32c is formed at a distal end side of lateral groove section 32b in such a manner as to be recessed downwards.

In the case that soft backup pin 10 (or hard backup pin 20) is held in engagement using engagement holding tool 30 held onto the mounting head of the component mounter, firstly, engagement holding tool 30 and engaging pin portion 13 of soft backup pin 10 (or engaging portion 25 of hard backup pin 20) are imaged from above with mark imaging camera 54 (refer to FIG. 9), which moves together with the mounting head, and the position of engaging pin portion 13 (or engaging portion 25) and the orientations of engagement protrusions 16 (or the orientation of engaging portion 25) are recognized by processing a captured image, whereby the position of vertical groove section 32a of each engaging groove 32 of cylindrical portion 31 is aligned with the position of each engagement protrusion 16 of engaging pin portion 13 (or each engagement protrusion 24 of engaging portion 25) by moving engagement holding tool 30 to a position above engaging pin portion 13 (or engaging portion 25) and rotating engagement holding tool 30 as required based on the results of the recognition.

In that state, engagement holding tool 30 is lowered so that cylindrical portion 31 is inserted into engaging pin portion 13 of soft backup pin 10 (or engaging portion 25 of hard backup pin 20), and in the midst of insertion of cylindrical portion 31, vertical groove sections 32a of individual engaging grooves 32 of cylindrical portion 31 are moved to be placed on corresponding engagement protrusions 16 of engaging pin portion 13 (or corresponding engagement protrusions 24 of engaging portion 25). In the midst of so moving vertical groove sections 32a, a downward pressing force of a spring (not shown) provided in an interior of engagement holding tool 30 then comes to act on engaging pin portion 13 (of engaging portion 25). Then, engagement holding tool 30 is rotated by a predetermined angle in an engaging direction at a point in time when engagement protrusions 16 of engaging pin portion 13 (or engagement protrusions 24 of engaging portion 25) are inserted into upper sections of vertical groove sections 32a of individual engaging grooves 32, so that lateral groove sections 32b of individual engaging grooves 32 of cylindrical portion 31 are moved to be placed on corresponding engagement protrusions 16 of engaging pin portion 13 (or corresponding engagement protrusions 24 of engaging portion 25).

Thereafter, engaging pin portion 13 (or engaging portion 25) is pressed down by the spring (not shown) in the interior of engagement holding tool 30 as a result of engagement holding tool 30 being raised, and individual engagement protrusions 16 of engaging pin portion 13 (or individual engagement protrusions 24 of engaging portion 25) fit in corresponding engagement recessed sections 32c of individual engaging grooves 32, thereby an engaging state being made. In the case that the engagement is released, the raising and lowering operations and the rotating operation of engagement holding tool 30 are performed in an opposite order and in an opposite direction to those in which engagement holding tool 30 is in the engaging state. The raising and lowering operations and the rotating operation of engagement holding tool 30 described above are controlled by control device 51 (refer to FIG. 9) of the component mounter.

Figure 8:
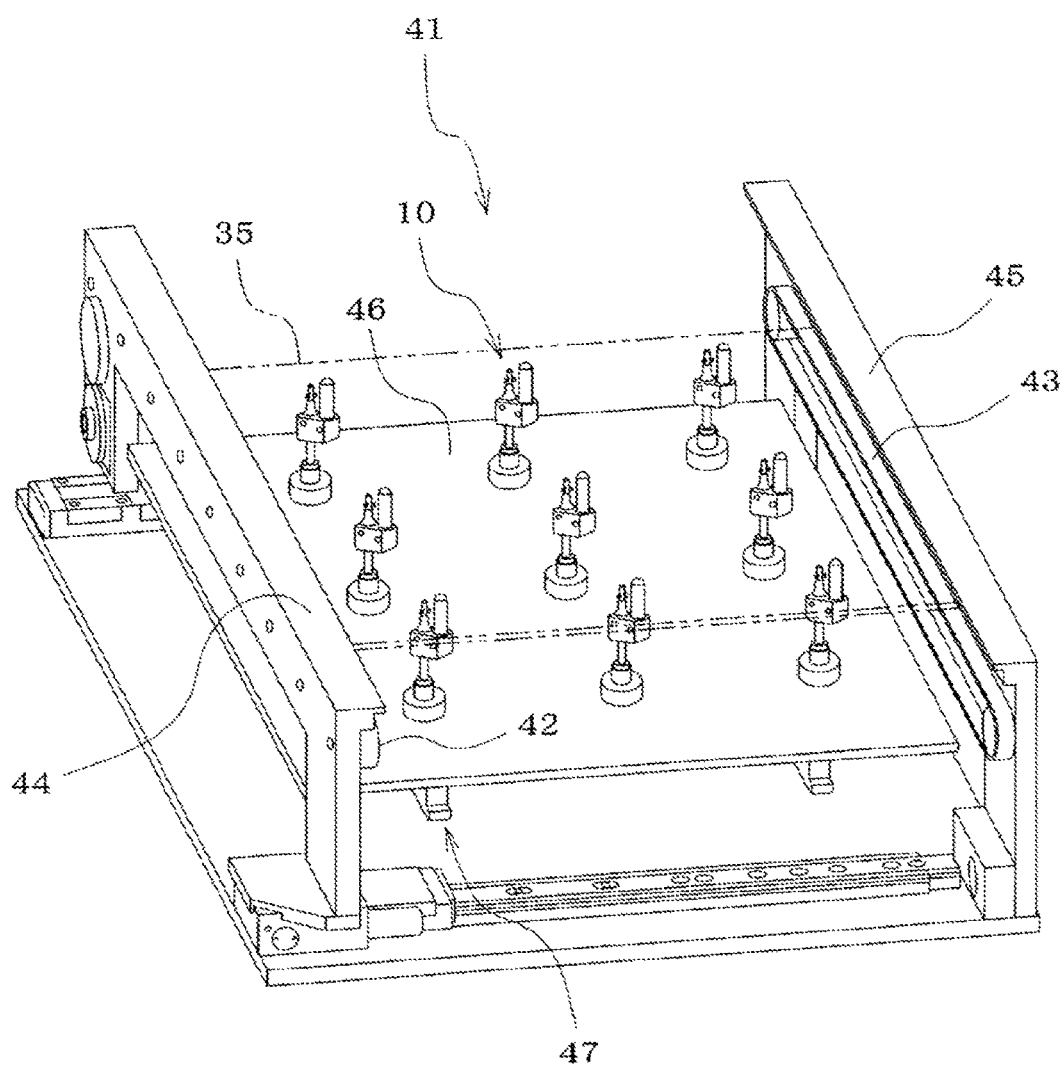
FIG. 8 is a perspective view showing a component mounting station of a component mounter.

Next, the configuration of component mounting station 41 of the component mounter will be described by use of FIG. 8. Component mounting station 41 constitutes a place where a component is mounted on circuit board 35 which is conveyed therein by conveyors 42, 43 by use of the mounting head of the component mounter. Conveyors 42, 43 are disposed parallel to a conveyance direction of circuit board 35 such as to convey circuit board 35 while allowing both left and right side sections of circuit board 35 to rest thereon, and rail 45 for holding right-hand side conveyor 43 constitutes a reference rail whose positioned is fixed, while rail 44 for holding left-hand side conveyor 42 constitutes a movable rail which can move in a width direction of circuit board 35 in accordance with a width thereof.

Backup plate 46, where soft backup pins 10 or hard backup pins 20 are placed, is provided horizontally at component mounting station 41. This backup plate 46 is formed of a magnetic material such as iron or the like, so that soft backup pin 10 or hard backup pin 20 is held securely onto backup plate 46 by magnet 14 or 23. Backup plate 46 is designed to be lifted up and lowered by lifting and lowering device 47 (refer to FIG. 9), so that when circuit board 35 conveyed in is clamped, backup plate 46 is lifted up or raised to an upper limit position, whereas when circuit board 35 is released from the clamped state, backup plate 46 is lowered to a lower limit position.

In the present first embodiment, the size of backup plate 46 is set larger than the size of circuit board 35, so that a section of backup plate 46 which protrudes from a portion residing directly below circuit board 35 is used as a backup pin storage section, whereby soft backup pins 10 or hard backup pins 20 for exchange are placed on this backup pin storage section for storage. The backup pin storage section may be provided at a place different or separate from backup plate 46 (for example, near conveyors 42, 43); in short, the backup pin storage section only needs to be provided within an area over which engagement holding tool 30 held onto the mounting head can move to cover.

The component mounter includes part imaging camera 53 (refer to FIG. 9) for imaging from a lower face side thereof a component picked up by and held to suction nozzle 37 held onto the mounting head and mark imaging camera 54 (refer to FIG. 9) for imaging a reference position mark (not shown) on circuit board 35. Mark imaging camera 54 is caused to move together with the mounting head by mounting head moving device 52 (refer to FIG. 9) and is used as a camera for imaging engaging pin portion 13 of soft backup pin 10 or engaging portion 25 of hard backup pin 20 from above. A size of a visual field of mark imaging camera 54 is set at a visual field size in which soft pin portion 12 is put out of the visual field of mark imaging camera 54 when engaging pin portion 13 of soft backup pin 10 is imaged.

Figure 9:
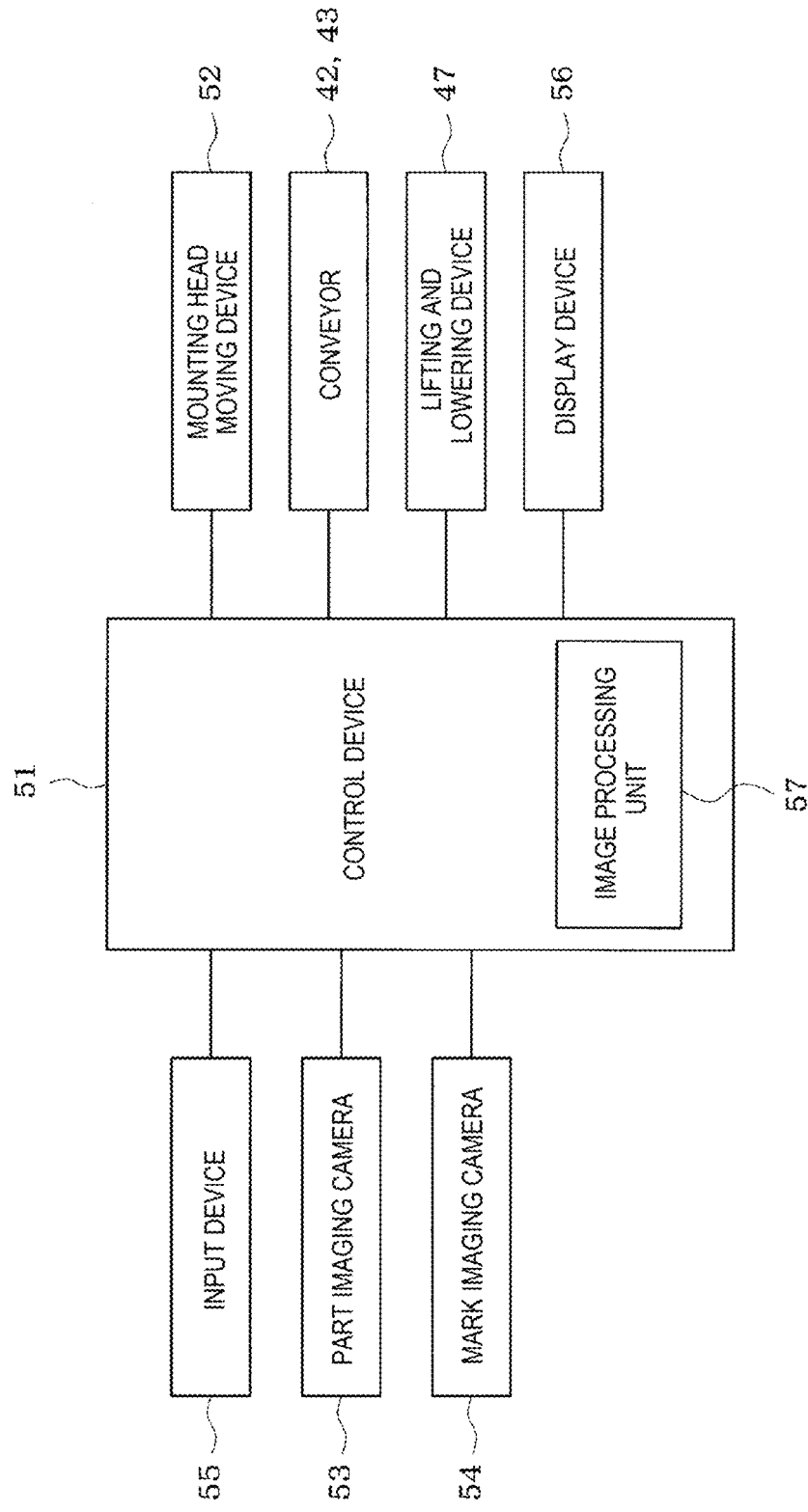
FIG. 9 is a block diagram showing a configuration of a control system of the component mounter.

As shown in FIG. 9, input device 55 such as a keyboard, a mouse, a touch panel, or the like and display device 56 such as LCD, EL, CRT, or the like are connected to control device 51 of the component mounter. Further, control device 51 incorporates therein image processing unit 57 for processing an image captured by part imaging camera 53 or mark imaging camera 54.

Control device 51 of the component mounter is configured mainly of one or multiple computers (CPUs) and controls operations involved in mounting a component on circuit board 35 by controlling operations of relevant sections of the component mounter. Furthermore, in exchanging backup pins 10 or 20 or changing an arrangement of such backup pins, control device 51 controls an exchanging operation of soft backup pins 10 or hard backup pins 20 between the backup pin storage section and backup plate 46 by controlling movements of engagement holding tool 30 held onto the mounting head in the up-down and left-right directions, raising/lowering and rotating operations of engagement holding tool 30, and an imaging operation of mark imaging camera 54, and in changing an arrangement of backup pins 10 or 20 on backup plate 46, control device 51 controls an engaging operation of engagement holding tool 30 with engaging pin portion 13 of backup pin 10 or engaging portion 25 of backup pin 20, the engaging operation being performed by: processing an image of engaging pin portion 13 of backup pin 10 or engaging portion 25 of backup pin 20, those being attempted to be held in engagement by engagement holding tool 30 and having been imaged or captured from above with mark imaging camera 54; recognizing a position of engaging pin portion 13 of backup pin 10 or engaging portion 25 of backup pin 20 through the image processing; positioning engagement holding tool 30 above the position so recognized; and lowering and rotating engagement holding tool 30 so positioned.

At this time, in processing the image captured by mark imaging camera 54, control device 51 identifies or discriminates soft backup pin 10 from hard backup pin 20 by determining on the existence of identification section 19. As a result, even though the shape of engaging pin portion 13 of soft backup pin 10 and the shape of engaging portion 25 of hard backup pin 20 are recognized as being common in the image captured by mark imaging camera 54, soft backup pin 10 and hard backup pin 20 can be discriminated from each other by determining on the existence of identification section 19 through image processing.

In the present first embodiment, since mark imaging camera 54 for imaging the reference position mark on circuit board 35 is also used as a camera for imaging engaging pin portion 13 of soft backup pin 10, there is provided an advantage of having to have no separate camera for exclusively imaging the backup pin; however, in general, mark imaging camera 54 has a narrow visual field and cannot image simultaneously both engaging pin portion 13 and soft pin portion 12 with the two relevant pin portions captured in its visual field, it is not clear from the image captured by mark imaging camera 54 in which direction soft pin portion 12 is positioned with respect to engaging pin portion 13. Then, in exchanging soft backup pins 10 or changing an arrangement of soft backup pins 10, in order to avoid an interference of adjacent soft backup pins 10 with each other, it is necessary to get to know a direction in which soft pin portion 12 is positioned with respect to engaging pin portion 13.

Then, in the present first embodiment, identification section 19 is provided in the position that is offset from the axial center of engaging pin portion 13, so that the offset direction of identification section 19 is designed to constitute an index of determining on the direction in which soft pin portion 12 is positioned with respect to engaging pin portion 13. Consequently, in the case that control device 51 processes the image captured by mark imaging camera 54 to thereby recognize identification section 19, control device 51 determines on the direction in which soft pin portion 12 is positioned by determining on the offset direction of identification section 19 in question, thereby estimating the position of soft pin portion 12. As a result, even though soft pin portion 12 is not captured in an image resulting from imaging engaging pin portion 13 of soft backup pin 10, the position of soft pin portion 12 can be estimated with good precision from the offset direction of identification section 19. That is, since a distance defined between engaging pin portion 13 and soft pin portion 12 is known data based on a product specification data or the like, in the event that the direction in which soft pin portion 12 is positioned with respect to engaging pin portion 13 is known, a position of soft pin portion 12 can be calculated based on the position of engaging pin portion 13.

With the present first embodiment that has been described heretofore, in holding engaging pin portion 13 of soft backup pin 10, in which soft pin portion 12 and engaging pin portion 13 are provided side by side, in engagement using engagement holding tool 30 attached to the mounting head of the component mounter, since engaging pin portion 13 is held in engagement through the bayonet-type engagement in which engaging pin portion 13 is held in engagement and released from engagement by raising/lowering and rotating operations of engagement holding tool 30, there is no need for movable section such as an opening and closing mechanism or the like in engagement holding tool 30, and hence, when compared with the conventional chuck device, not only can the configuration for holding backup pin 10 be made simple in structure and small in size, thereby contributing to a reduction in cost, but also engagement holding tool 30, which performs the engagement operations (raising and lowering, as well as rotating operations), can be prevented from coming into interference with adjacent backup pins 10, 20. Moreover, when compared with the conventional configuration for holding the backup pin by means of the suction force of negative pressure of the suction nozzle, backup pin 10, 20 can be held mechanically stably and in a secured fashion as a result of engaging pin portion 13 being brought into such engagement, whereby backup pin 10,20 held by engagement holding tool 30 can be prevented from deviating in position or falling. Further, since engaging pin portion 13 of soft backup pin 10 is formed into the shape common to engaging portion 25 of hard backup pin 20, even in the event that either of soft backup pin 10 and hard backup pin 20 is held in engagement, the selected backup pin can be held in engagement by use of identical engagement holding tool 30, whereby engagement holding tool 30 does not need to be exchanged, whereby exchange work of backup pins 10, 20 can be executed with good efficiency.

Second Embodiment

Next, a second embodiment will be described by use of FIG. 10. However, like reference numerals will be given to substantially like portions to those of the first embodiment, so that different portions of the second embodiment will mainly be described by omitting or simplifying a description of the like portions.

Figure 10:
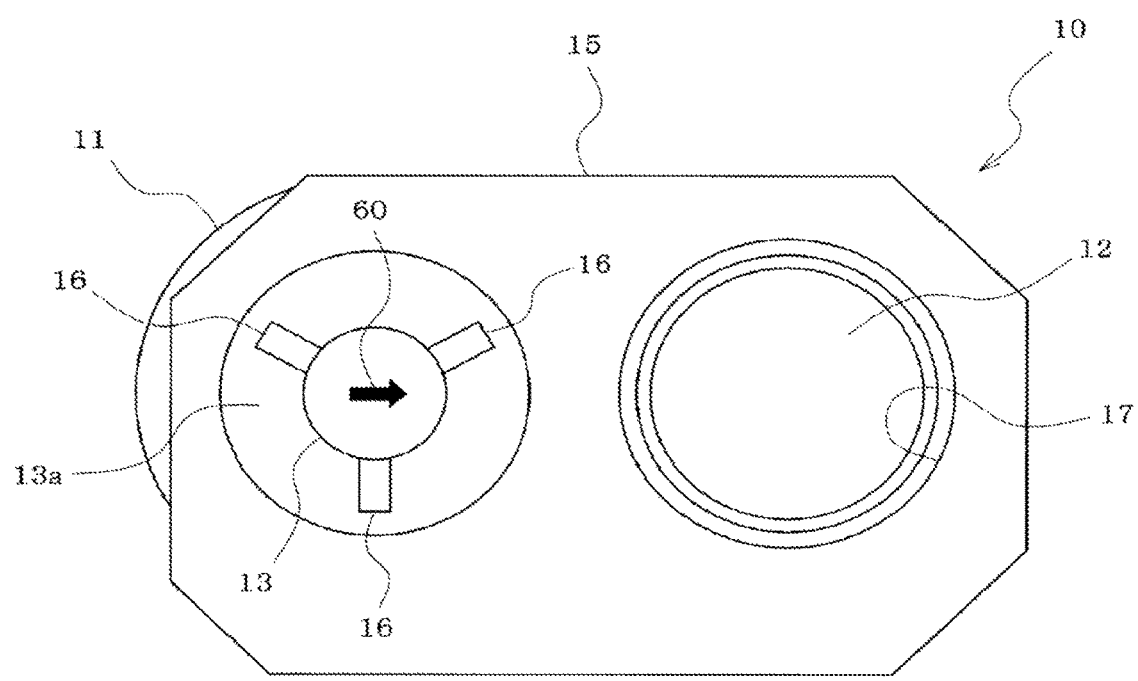
FIG. 10 is a plan view of a soft backup pin of a second embodiment as viewed from above.

In the first embodiment described above, identification section 19 is provided in the position lying offset from the axial center of engaging pin portion 13, and the direction in which soft pin portion 12 is positioned with respect to engaging pin portion 13 can be determined by determining on the offset direction of identification section 19; however, in the present second embodiment, as shown in FIG. 10, identification section 60 is formed on an upper end face of engaging pin portion 13 into a shape (for example, an arrow shape, a wedge shape, or the like) by which an orientation of identification section 60 can be identified, and in the case that control device 51 recognizes identification section 60 by processing an image captured by mark imaging camera 54, control device 51 may estimate a position of soft pin portion 12 by determining on a direction in which soft pin portion 12 is positioned with respect to engaging pin portion 13 by determining on an orientation of identification section 60.

With the present second embodiment described above, too, the same advantageous effect as that obtained with the first embodiment above can be obtained.

The present invention is not limited to the first and second embodiments described above, and hence, needless to say, the present invention can be carried out in various modified forms without departing from the spirit and scope of the invention, including, for example, a configuration in which the shape of soft backup pin 10 is modified or the configuration of engagement holding tool 30 is modified.

REFERENCE SIGNS LIST

10 . . . soft backup pin, 11 . . . base section, 12 . . . soft pin portion, 13 . . . engaging pin portion, 14 . . . magnet, 15 . . . holder section, 16 . . . engagement protrusion, 19 . . . identification section, 20 . . . hard backup pin, 24 . . . engagement protrusion, 25 . . . engaging portion, 30 . . . engagement holding tool, 32 . . . engaging groove, 35 . . . circuit board, 37 . . . suction nozzle, 41 . . . component mounting station, 42, 43 . . . conveyor, 46 . . . backup plate, 51 . . . control device, 52 . . . mounting head moving device, 53 . . . part imaging camera, 57 . . . image processing unit, 60 . . . identification section.

The invention claimed is:

1. A backup pin for supporting from below a circuit board on which a component is mounted at a component mounting station of a component mounter, the backup pin constituting a soft backup pin configured to be exchanged for a hard backup pin formed of a hard material, comprising:
   a base section configured to attach to a backup plate, the base section having a cylindrical shape;
   a holder section at an upper section of the base section;
   a soft pin portion formed of a soft elastic material and configured to support from below the circuit board, the soft pin portion being exchangeably-attached to the holder section; and
   an engaging pin portion configured to be held in engagement and released from engagement by an engagement holding tool attached to a mounting head of the component mounter performing raising and lowering, as well as rotating operations,
   wherein the soft pin portion and the engaging pin portion are provided side by side to the holder section.

2. The backup pin according to claim 1,
   wherein the engaging pin portion comprises an identification section by which the engaging pin portion is discriminated from the hard backup pin through image processing.

3. The backup pin according to claim 2,
   wherein the identification section is provided in a position lying offset from an axial center of the engaging pin portion, and
   wherein a direction in which the soft pin portion is positioned with respect to the engaging pin portion is determined by determining on an offset direction of the identification section through image processing.

4. The backup pin according to claim 2,
   wherein the identification section is formed into a shape by which an orientation thereof is identified, and
   wherein a direction in which the soft pin portion is positioned with respect to the engaging pin portion is determined by determining on an orientation of the identification section through image processing.

5. The backup pin according to claim 1, configured to be applied to the component mounter in which the backup plate is provided on the component mounting station, the backup plate being configured as a place where to mount the backup pin and formed of a magnetic material,
   wherein a magnet is provided in a lower section of the base section, the magnet being configured to hold the backup pin onto the backup plate by means of a magnetic force.

6. An automatic backup pin exchange system, comprising:
   a backup pin storage section that stores both a soft backup pin and a hard backup pin, the soft backup pin including:
      a base section configured to attach to a backup plate, the base section having a cylindrical shape;
      a holder section at an upper section of the base section;
      a soft pin portion formed of a soft elastic material and configured to support from below a circuit board, the soft pin portion being exchangeably-attached to the holder section; and
      an engaging pin portion configured to be held in engagement and released from engagement by an engagement holding tool attached to a mounting head of a component mounter performing raising and lowering, as well as rotating operations, the soft pin portion and the engaging pin portion being provided side by side to the holder section;
   a backup plate configured to enable both the soft backup pin and the hard backup pin to be placed thereon;
   a camera configured to image either the engaging pin portion of the soft backup pin or an engaging portion of the hard backup pin from above with either the engaging pin portion or the engaging portion captured in a visual field thereof; and
   a control device configured to control movements in up-down and left-right directions and raising/lowering and rotating operations of an engagement holding tool, being attached to a mounting head of the component mounter, and an imaging operation of the camera,
   wherein in exchanging the soft backup pin or the hard backup pin between the backup pin storage section and the backup plate or changing an arrangement of the soft backup pin or the hard backup pin on the backup plate, the control device causes the engagement holding tool to engage with the engaging pin portion or the engaging portion of the hard backup pin, an engaging control being performed: by recognizing a position of the engaging pin portion or the engaging portion of the hard backup pin; by processing an image of the engaging pin portion or the engaging portion of the hard backup pin which is to be held in engagement by the engagement holding tool, the image being captured by the camera from above; by positioning the engagement holding tool in a position lying above the position so recognized; and by causing the engagement holding tool to perform lowering and rotating operations.

7. The automatic backup pin exchange system according to claim 6,
   wherein an identification section is provided on the engaging pin portion of the soft backup pin, the identification section being configured to discriminate the soft backup pin from the hard backup pin through image processing, and
   wherein the control device discriminates the soft backup pin from the hard backup pin by determining an existence of the identification section by processing an image captured by the camera.

8. The automatic backup pin exchange system according to claim 7,
   wherein the identification section is provided in a position lying offset from an axial center of the engaging pin portion,
   wherein a visual field of the camera is sized so that the soft pin portion is put out of the visual field when the camera images the engaging pin portion, and
   wherein when the control device recognizes the identification section by processing an image captured by the camera, the control device estimates a position of the soft pin portion by determining a direction in which the soft pin portion is positioned by determining an offset direction of the identification section.

9. The automatic backup pin exchange system according to claim 7,
   wherein the identification section is formed into a shape by which an orientation thereof is identified,
   wherein a visual field of the camera is sized so that the soft pin portion is put out of the visual field when the camera images the engaging pin portion, and
   wherein when the control device recognizes the identification section by processing an image captured by the camera, the control device estimates a position of the soft pin portion by determining a direction in which the soft pin portion is positioned with respect to the engaging pin portion by determining an orientation of the identification section.

* * * * *